(12) United States Patent
Kishiro

(10) Patent No.: US 7,498,636 B2
(45) Date of Patent: Mar. 3, 2009

(54) SEMICONDUCTOR DEVICE AND METHOD OF MANUFACTURING THE SAME

(75) Inventor: Koichi Kishiro, Tokyo (JP)

(73) Assignee: Oki Electric Industry Co., Ltd., Tokyo (JP)

( * ) Notice: Subject to any disclaimer, the term of this patent is extended or adjusted under 35 U.S.C. 154(b) by 166 days.

(21) Appl. No.: 11/405,570

(22) Filed: Apr. 18, 2006

(65) Prior Publication Data

US 2006/0255465 A1    Nov. 16, 2006

(30) Foreign Application Priority Data

May 13, 2005    (JP)    ............................... 2005-141577

(51) Int. Cl.
*H01L 27/12*    (2006.01)
(52) U.S. Cl. ........................ 257/349; 257/347; 257/758; 257/E27.112; 438/298
(58) Field of Classification Search ................. 257/349, 257/E27.112
See application file for complete search history.

(56) References Cited

U.S. PATENT DOCUMENTS

| 6,972,218 | B2 | 12/2005 | Kishiro |
| 7,375,397 | B2* | 5/2008 | Shizuno ...................... 257/347 |
| 2004/0207014 | A1 | 10/2004 | Kishiro |
| 2004/0253798 | A1* | 12/2004 | Mori .......................... 438/517 |
| 2006/0255408 | A1* | 11/2006 | Shizuno ...................... 257/347 |

* cited by examiner

*Primary Examiner*—Tu-Tu V Ho
(74) *Attorney, Agent, or Firm*—Volentine & Whitt, P.L.L.C.

(57) ABSTRACT

Variations in characteristics of transistors and a deterioration of a gate oxide film are reduced in a WP step. A method of manufacturing a semiconductor device of the present invention includes the steps of providing a SOI substrate having a semiconductor layer formed on a supporting substrate through a first insulating film, forming a plurality of SOI transistors on the SOI substrate, wiring the SOI transistors over a plurality of wiring layers, and providing electrical connection between the supporting substrate and the SOI transistors through a top layer wire of the plurality of wiring layers.

5 Claims, 7 Drawing Sheets

SEMICONDUCTOR DEVICE AND METHOD OF MANUFACTURING THE SAME

BACKGROUND OF THE INVENTION

1. Field of the Invention

The present invention relates to a semiconductor device and in particular to an effective technology for a semiconductor device having a Silicon On Insulator structure (hereinafter referred to as SOI).

2. Description of the Related Art

At present, a technology referred to as SOI has been used in semiconductor devices in order to achieve lower power consumption and high speed operation. When IC's are manufactured using the SOI technology, they are manufactured from a SOI wafer.

The SOI wafer refers to a wafer having a structure in which a substrate is separated from a semiconductor layer, which servers as an element formation area, by a thick silicon oxide film (hereinafter referred to as the buried oxide film) which is a first insulating film. When a transistor is formed in the semiconductor layer of the SOI wafer, a silicon serving as a channel region and a diffusion region is completely insulated from the substrate by the silicon oxide film.

A transistor formed in the semiconductor layer of the SOI wafer (hereinafter referred to as the SOI transistor) varies in characteristics due to hot carriers which are generated and accumulated in the channel region of the SOI transistor when the SOI transistor is on. In order to suppress such variations, it is necessary to stabilize the operation of the SOI transistor by fixing the potential of the channel region. Since an IC is normally sealed by resin or ceramic, it is difficult to establish electrical connection between the IC and the substrate. Therefore, a technique may be used in which a metal plate is adhered on the bottom surface of the IC so as to provide a bonding that differs from a bonding to the surface of the IC, and fix the potential of the metal plate from the outside of a package.

When the fixing of the potential via the bottom surface of the IC is not carried out, it is necessary to form an electrical contact from the surface of the SOI wafer to the substrate during a wafer process. In the process for a conventional SOI transistor, in order to provide electrical connection between the surface of the wafer and the substrate, a contact hole penetrating the buried oxide film is formed and the hole is filled with a conductive material.

For reference, Japanese Patent Kokai No. 2004-319853, for example, discloses the technique for providing electrical connection between the surface of an IC and a substrate.

However, in the techniques described above and in Japanese Patent Kokai No. 2004-319853, a contact connected to the substrate fixes the potential of the substrate to GND. Accordingly, a terminal connected to GND within the circuit has a connection to the substrate via a wire formed of a first metal. The substrate is vulnerable to an electrical charge due to bias voltage of a stage applied during CVD and etching processes, and bias voltage of an electrostatic chuck used for holding the wafer to the stage. The generated charge is supplied to the transistor via the contact connected to the substrate, causing variations in characteristics of the transistor, deterioration of the gate oxide film, and the like.

SUMMARY OF THE INVENTION

It is therefore an object of the present invention to provide a semiconductor device and a method of manufacturing the same which solves the problems described above, and minimizes variations in characteristics of transistors and deterioration of a gate oxide film.

A method of manufacturing a semiconductor device of the present invention includes the steps of providing a SOI substrate having a semiconductor layer formed on a supporting substrate through a first insulating film, forming a plurality of SOI transistors on the SOI substrate, wiring the SOI transistors over a plurality of wiring layers, and providing electrical connection between the supporting substrate and the SOI transistors via a top layer wire of the plurality of wiring layers.

Also, a semiconductor device of the present invention has a semiconductor layer including a channel region and a diffusion region sandwiching the channel region, and an element separation layer formed on a supporting substrate through a first insulating layer. The semiconductor device includes a gate electrode formed on the channel region of the semiconductor layer through a second insulating layer, a third insulating layer formed on the element separation layer, semiconductor layer, and gate electrode, a first wiring layer formed on the third insulating layer, a first conductor extending through the third insulating layer, element separation layer, and first insulating layer so as to electrically connect to the supporting substrate, a second conductor extending through the third insulating layer so as to electrically connect to the diffusion region of the semiconductor layer, and a top layer wire formed on the first wiring layer through a fourth insulating layer so as to electrically connect to the first conductor, and the second conductor or the third conductor.

By employing the structure of the semiconductor device of the present invention, it is possible to minimize variations in the characteristics of the transistors and a deterioration of the gate oxide film.

DETAILED DESCRIPTION OF THE INVENTION

Embodiments of the present invention will be hereinafter described with reference to the drawings.

First Embodiment

Figure 1:
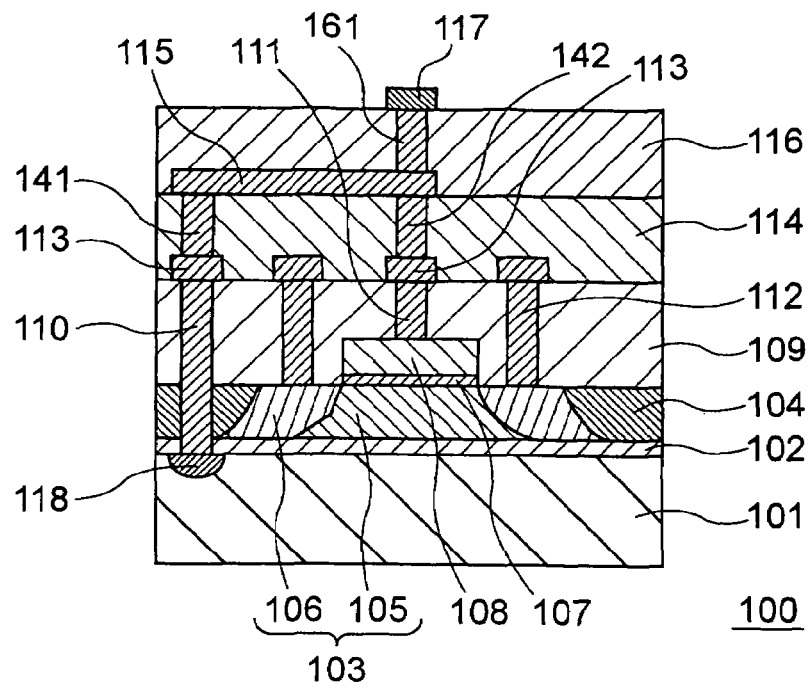
FIG. 1 is a cross-sectional view showing a semiconductor device in a first embodiment of the present invention.

A structure of a semiconductor device according to a first embodiment of the present invention will be described with reference to FIG. 1. A semiconductor device 100 of the first embodiment of the present invention has a semiconductor layer 103 and an element separation layer 104 formed on a supporting substrate 101, made of silicon or the like, through a first insulating layer (hereinafter referred to as the buried oxide layer) 102. The semiconductor layer 103 includes a channel region 105 and a diffusion region 106 sandwiching the channel region 105. A gate electrode 108 is formed on the channel region 105 of the semiconductor layer 103 through a second insulating layer (hereinafter referred to as the gate insulation film) 107. A third insulating layer (hereinafter referred to as the first inter-layer insulating film) 109 is formed on the element separation layer 104, semiconductor layer 103, and gate electrode 108. A first conductor 110 is formed through the first inter-layer insulating film 109, element separation layer 104, and buried oxide film 102 so as to electrically connect to the supporting substrate 101. Further, a second conductor 111 is formed through the first inter-layer insulating film 109 so as to electrically connect to the gate electrode 108, and a third conductor 112 is formed through the first inter-layer insulating film 109 so as to electrically connect to the diffusion region 106 of the semiconductor layer 103. A first wiring layer 113 is formed on the first inter-layer insulating film 109. The first wiring layer 113 connects the second conductor 111 with the third conductor 112 to form a desired circuit. A top layer wire 115 is formed on a fourth insulating layer (hereinafter referred to as the second inter-layer insulating film) 114 which is formed on the first wiring layer 113 and on the first inter-layer insulating film 109. The first conductor 110, which electrically connects to the supporting substrate 101, is electrically connected to the second conductor 111 or third conductor 112 through the top layer wire 115. A fifth insulating layer (hereinafter referred to as the third inter-layer insulating film) 116 is formed on the top layer wire 115. An external terminal 117 formed on the third inter-layer insulating film 116 is electrically connected to the top layer wire 115. Generally, the supporting substrate 101 is connected to a ground potential through the external terminal 117. In this embodiment, the external terminal 117 is an electrode pad to which an external potential is applied by wire bonding or the like.

Figure 3A:
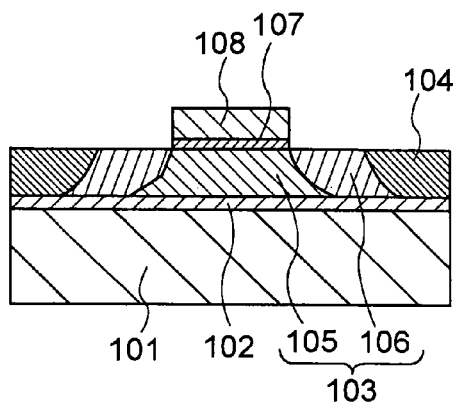
FIGS. 3A to 3F are process diagrams showing a method of manufacturing the semiconductor device in the first embodiment.

The semiconductor device having the SOI structure described above is manufactured by, for example, the following steps. A method of manufacturing the semiconductor device of this embodiment will be described with reference to FIGS. 3A to 3F. As illustrated in FIG. 3A, the supporting substrate 101 having the semiconductor layer 103 formed thereon through the buried oxide film 102 is provided (the semiconductor layer 103, buried oxide film 102, and supporting substrate 101 are collectively referred to as the SOI substrate). Each semiconductor layer 103 is separated by the element separation layer 104 which is formed in the semiconductor layer 103 using LOCOS or STI (Shallow Trench Isolation) technologies. The gate insulating film 107 is formed on the semiconductor layer 103 by, for example, a thermal oxidation method. Next, polysilicon, for example, is deposited on the element separation layer 104, semiconductor layer 103, and gate insulating film 107. The polysilicon is then patterned by photolithography to form the gate electrode 108 on the gate insulating film 107, and impurities are implanted into the diffusion region 106 of the semiconductor layer 103 to complete the formation of a SOI transistor.

Figure 3B:
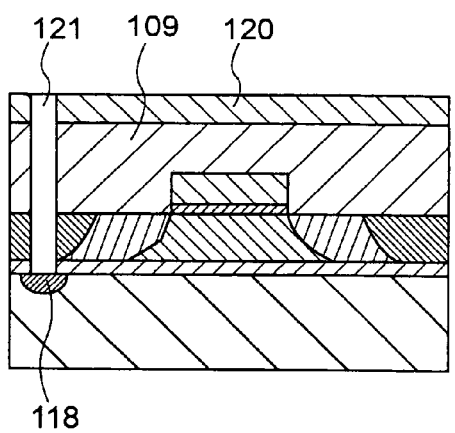
Figure 3C:
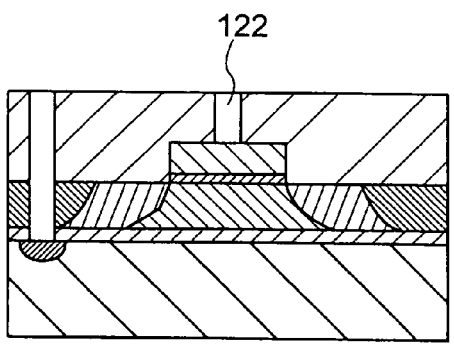

Subsequently, as shown in FIG. 3B, the first inter-layer insulating film 109 is deposited on the element separation layer 104, semiconductor layer 103, and gate electrode 108 by, for example, a CVD method. After the first inter-layer insulating film 109 has been deposited, a resist 120 is applied on the first inter-layer insulating film 109, and a contact hole 121 is formed through the element separation layer 104 to the supporting substrate 101 by, for example, a known dry etching method or the like. In order to reduce the resistance of a contact area, contact implantation is performed. Through the contact implantation, a high-concentration implantation region 118 is formed in the supporting substrate 101 at the bottom of the contact hole. In this event, the concentration of impurities implanted into the supporting substrate 101 is, for example, approximately $1 \times 10^{20\text{-}21}$ ions/cm$^3$. Further, as shown in FIG. 3C, contact holes 122 are formed to reach the diffusion region 106 and the gate electrode 108 (contact hole 122 to reach the diffusion region 106 is not shown), and then the resist is removed. Generally, since the contact hole 121 has a depth of approximately 0.6 to 1.0 μm, it is preferable that the contact hole 121 has a diameter of approximately one-half of the depth thereof so that ion species can reach the bottom of the contact 121.

Figure 3D:
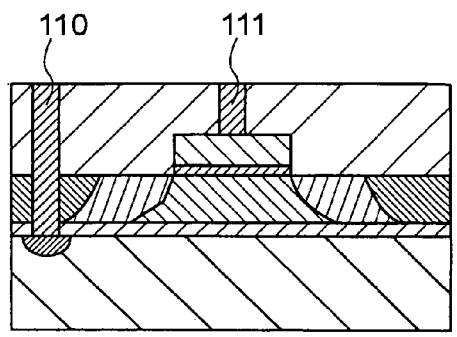

Subsequently, as shown in FIG. 3D, tungsten (W) or the like is accumulated in the contact holes 121, 122 to form the first conductor 110 which electrical connects to the previously formed high-concentration implanted region 118 in the supporting substrate 101, the second conductor 111 which electrically connects to the gate electrode 108, and the third conductor 112 (not shown) which electrically connects to the diffusion region 106 of the semiconductor layer 103. Excess tungsten (W) is removed by etch-back or the like.

Figure 3E:
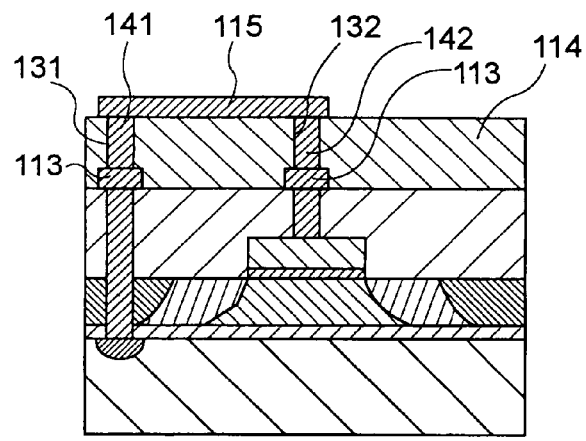
Figure 3F:
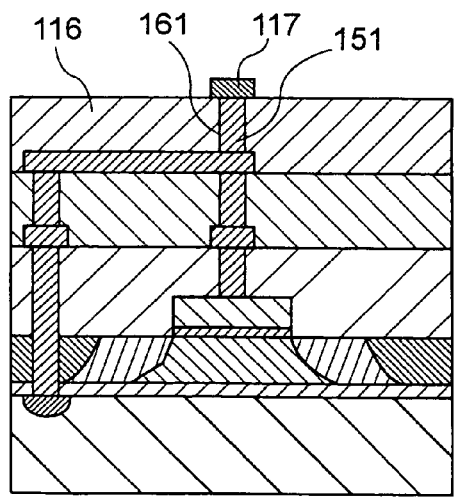

As shown in FIG. 3E, a metal film made of Al or Al alloy is deposited on the first inter-layer insulating film 109, first conductor 110, second conductor 111, and third conductor 112 by, for example, a sputtering method, and then the metal film is patterned by photolithography to form the first wiring layer 113. The second inter-layer insulating film 114 is deposited on the first inter-layer insulating film 109 and first wiring layer 113 by, for example, a CVD method. After the second inter-layer insulating film 114 has been deposited, a resist or the like is applied on the second inter-layer insulating film 114, and the contact hole 131 is formed to reach the first conductor 110 by, for example, a known dry etching method or the like. Further, the contact hole 132 is formed to reach the first wiring layer. Subsequently, tungsten (W) or the like is accumulated within the contact holes 131, 132 to form a fourth conductor 141 and a fifth conductor 142. Excess tungsten (W) or the like is removed by etch-back or the like. A metal film made of Al or Al alloy is deposited on the second inter-layer insulating film 114, fourth conductor 141, and fifth conductor 142 by, for example, a sputtering method, and then the metal film is patterned by photolithography to form the top layer wire 115 to provide electrical connection between the fourth conductor 141 and fifth conductor 142.

The third inter-layer insulating film 116 is deposited on the second inter-layer insulating film 114 and top layer wire 115 by, for example, a CVD method. After the third inter-layer insulating film 116 has been deposited, a resist or the like is applied on the third inter-layer insulating film 116, and a contact hole 151 is formed to reach the top layer wire 115 by, for example, a known dry etching method or the like. Subsequently, tungsten (W) or the like is accumulated within the contact hole 151 to form a sixth conductor 161. Excess tungsten (W) or the like is removed by etch-back or the like. A metal film made of Al or Al alloy is deposited on the third inter-layer insulating film 116 and sixth conductor 161 by, for example, a sputtering method, and then the metal film is patterned by photolithography to form the external terminal 117. In this embodiment, the external terminal 117 is an electrode pad.

According to the structure of the semiconductor device and the method of manufacturing the same of this embodiment, the electrical connection between the supporting substrate 101 and the second conductor 111 is performed by the top layer wiring 115. Accordingly, an electrical charge generated on the supporting substrate 101 in steps before the forming step of the top layer wire 115 is prevented from reaching the SOI transistor. In addition, even if an electrical charge is generated in steps after the forming step of the top layer wire 115, variations in the characteristics of the SOI transistor can be reduced as compared with the prior art.

Second Embodiment

Figure 2:
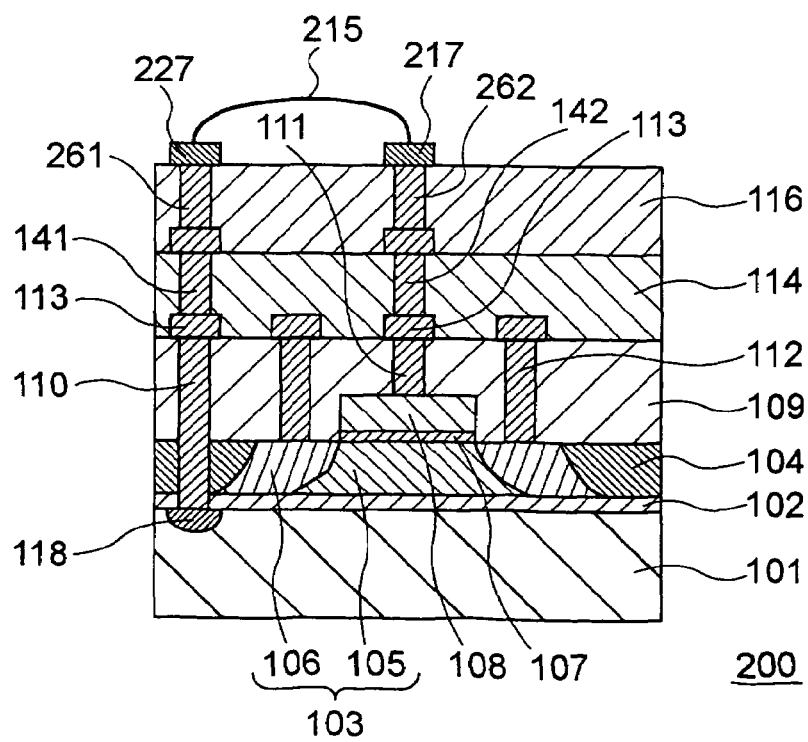
FIG. 2 is a cross-sectional view showing a semiconductor device in a second embodiment of the present invention.

FIG. 2 is a cross-sectional view showing a semiconductor device in a second embodiment of the present invention. A structure of the semiconductor device of the second embodiment of the present invention will be described with reference to FIG. 2. The same reference numerals are assigned for components identical to those in the first embodiment.

Since the structure up to the second inter-layer insulating film 114 is similar to that of the first embodiment, a description thereof is omitted. A third inter-layer insulating film 116 is formed on the second inter-layer insulating film 114, fourth conductor 141, and fifth conductor 142. A sixth conductor 262 is formed through the third inter-layer insulating film 116 to electrically connect to the fifth conductor 142. A seventh conductor 261 is formed through the third inter-layer insulating film 116 to electrically connect to the fourth conductor 141. A first external terminal 217 is formed on the sixth conductor 262. A second external terminal 227 is formed on the seventh conductor 261. In this embodiment, the first external terminal 217 and second external terminal 227 are both electrode pads. The first external terminal 217 is electrically connected to the second external terminal 227 through a wire bonding 215.

The semiconductor device with the SOI structure of the second embodiment described above is manufactured by, for example, the following steps. A method of manufacturing the semiconductor device of this embodiment will be described with reference to FIGS. 4A to 4C. Since the steps before FIG. 4A are similar to those in the manufacturing method of the first embodiment, a description thereof is omitted.

Figure 4A:
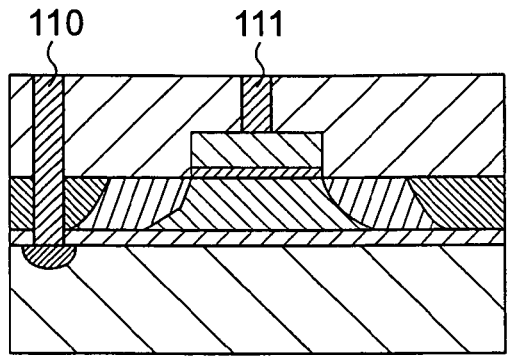
FIGS. 4A to 4C are process diagrams showing a method of manufacturing the semiconductor device in the second embodiment.

As shown in FIG. 4A, tungsten (W) or the like is accumulated within the contact holes 121, 122 to form the first conductor 110 which electrically connects to the previously formed high-concentration implanted region 118 of the supporting substrate 101, the second conductor 111 which electrically connects to the gate electrode 108, and the third conductor 112 which electrically connects to the diffusion region 106 of the semiconductor layer 103. Excess tungsten (W) or the like is removed by etch-back or the like.

Figure 4B:
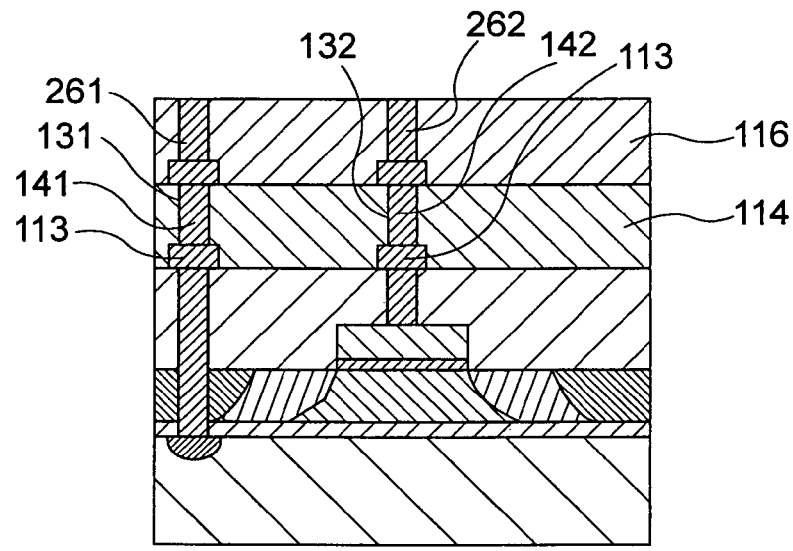

As illustrated in FIG. 4B, a metal film made of Al or Al alloy is deposited on the first inter-layer insulating film 109, first conductor 110, second conductor 111, and third conductor 112 by, for example, a sputtering method, and then the metal film is patterned by photolithography to form the first wiring layer 113. The second inter-layer insulating film 114 is deposited on the first inter-layer insulating film 109 and first wiring layer 113 by, for example, a CVD method. After the second inter-layer insulating film 114 has been deposited, a resist or the like is applied on the second inter-layer insulating film 114, and the contact hole 131 is formed to reach the first conductor 110 by, for example, a known dry etching method or the like. The contact hole 132 is also formed to reach the first wiring layer 113. Subsequently, tungsten (W) or the like is accumulated within the contact holes 131, 132 to form the fourth conductor 141 and fifth conductor 142. Excess tungsten (W) or the like is removed by etch-back or the like.

The third inter-layer insulating film 116 is deposited on the second inter-layer insulating film 114, fourth conductor 141, and fifth conductor 142 by, for example, a CVD method. After the third inter-layer insulating film 116 has been deposited, a resist or the like is applied on the third inter-layer insulating film 116, and a contact hole is formed to reach the fourth conductor 141 and fifth conductor 142 by, for example, a known dry etching method or the like. Subsequently, tungsten (W) or the like is accumulated within the contact hole to form a sixth conductor 262 and a seventh conductor 261. Excess tungsten (W) is removed by etch-back or the like.

Figure 4C:
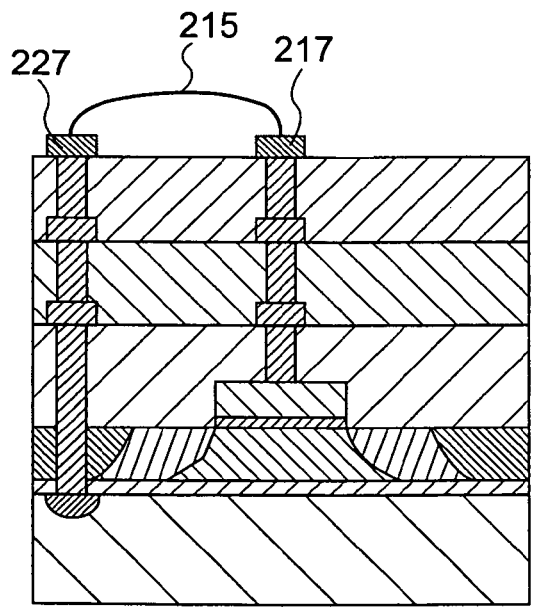

As shown in FIG. 4C, a metal film made of Al or Al alloy is deposited on the third inter-layer insulating film 116, sixth conductor 262, and seventh conductor 261 by, for example, a sputtering method, and then the metal film is patterned by photolithography to form the first external terminal 217 and second external terminal 227. In this embodiment, the first external terminal 217 and second external terminal 227 are electrode pads.

According to the structure of the semiconductor device and the method of manufacturing the same of this embodiment, the supporting substrate 101 is electrically connected to the second conductor 111 through the wire bonding 215. Accordingly, an electrical charge generated on the supporting substrate 101 in steps before the forming step of the wire bonding 215 is prevented from reaching the SOI transistor. In addition, even if an electrical charge is generated after the forming step of the wire bonding 215, variations in the characteristics of the SOI transistor can be reduced as compared with the prior art.

Third Embodiment

Figure 5:
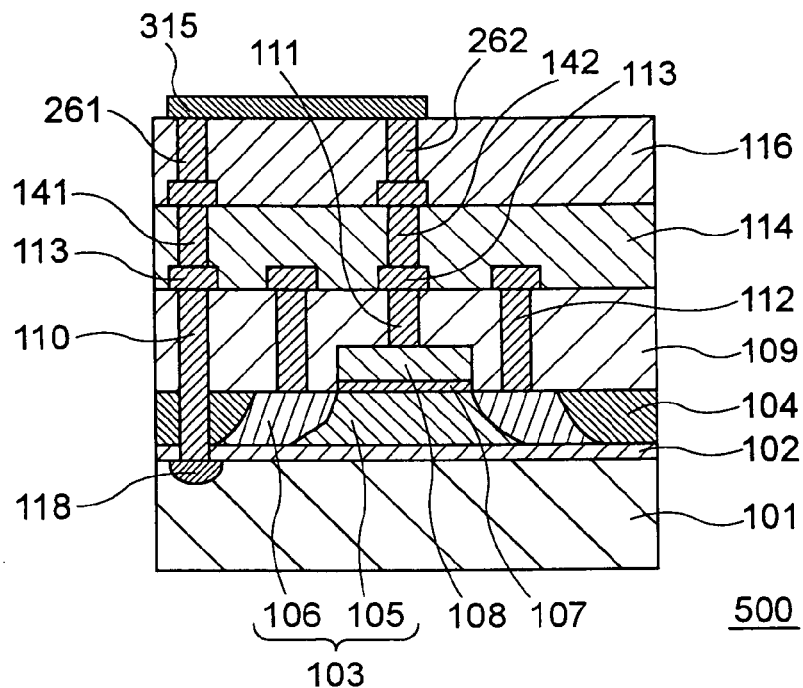
FIG. 5 is a cross-sectional view showing a semiconductor device in a third embodiment of the present invention.

FIG. 5 is a cross-sectional view showing a semiconductor device in a third embodiment of the present invention. Features of this embodiment will be described in comparison with those of the second embodiment. In the second embodiment, the first external terminal 217 is connected to the second external terminal 227 through the wire bonding 215, whereas in the third embodiment, the first external terminal 217 is integrally formed with the second external terminal 227. Therefore, electrical connection between the sixth conductor 262 and the seventh conductor 261 is established through a common external terminal 315.

According to the structure of the semiconductor device of this embodiment, similar effects to the second embodiment can be obtained while removing the wire bonding step which is required in the second embodiment. Consequently, the manufacturing steps can be simplified to reduce the manufacturing cost.

Fourth Embodiment

Figure 6:
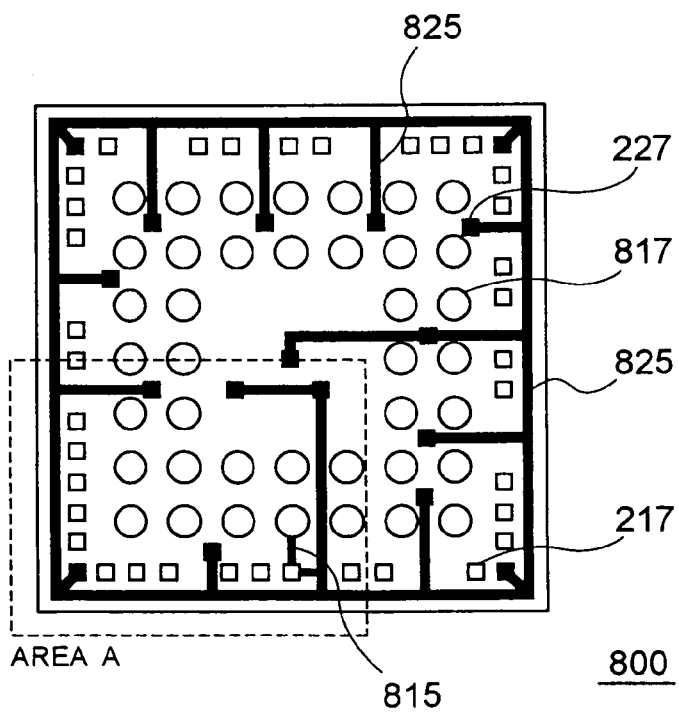
FIG. 6 is a top view showing a semiconductor device in a fourth embodiment of the present invention.
Figure 7:
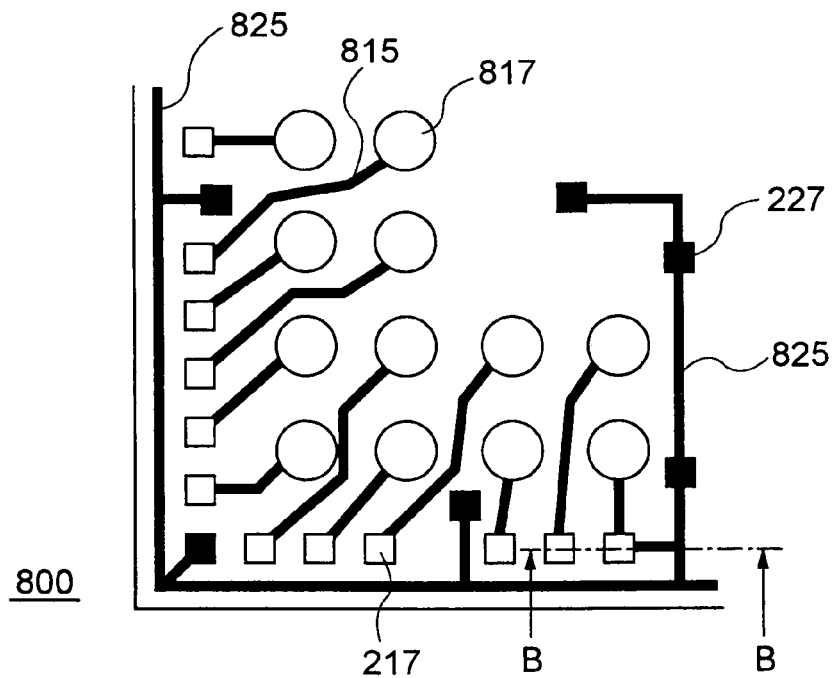
FIG. 7 is an enlarge view of an area A in FIG. 6.
Figure 8:
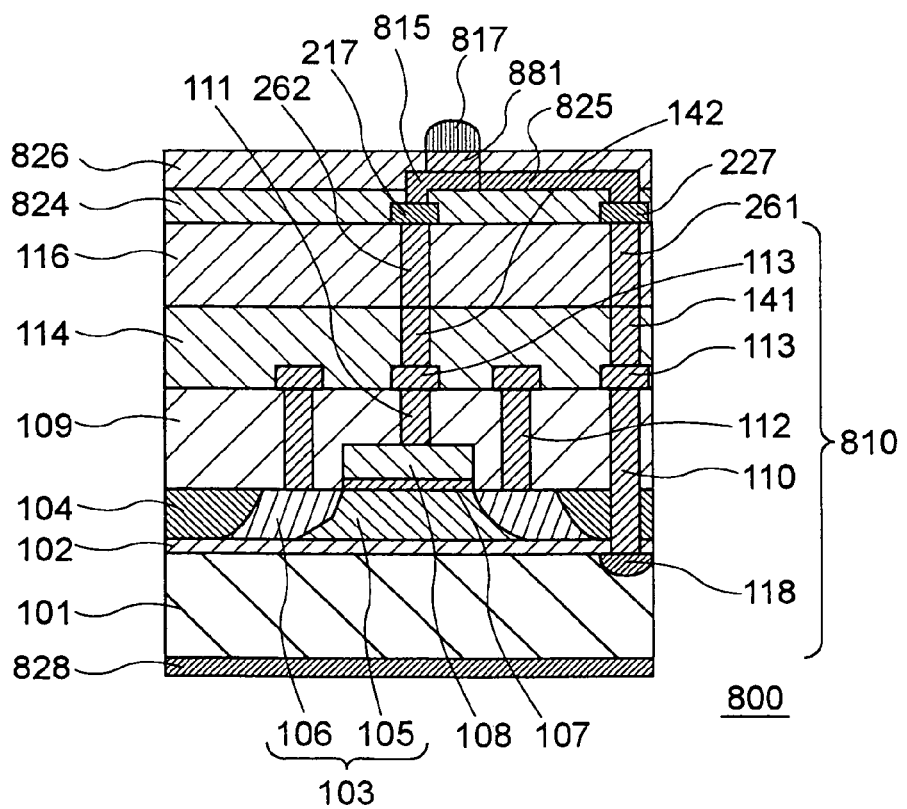
FIG. 8 is a cross-sectional view taken along B-B' in FIG. 7.

FIG. 6 is a top view of a semiconductor device in a fourth embodiment of the present invention. FIG. 7 is an enlarged view of an area A in FIG. 6. FIG. 8 is a cross-sectional view taken along B-B' in FIG. 7. The fourth embodiment will be described in detail with reference to these figures.

As shown in FIG. 8, a semiconductor device 800 of the fourth embodiment of the present invention includes a semiconductor layer 103 and an element separation layer 104 formed on a supporting substrate 101 made of silicon or the like through a first insulating layer (hereinafter referred to as the buried oxide film) 102. The semiconductor layer 103 includes a channel region 105 and a diffusion region 106 sandwiching the channel region 105. A gate electrode 108 is formed on the channel region 105 of the semiconductor layer 103 through a second insulating layer (hereinafter referred to as the gate insulation film) 107. A third insulating layer (hereinafter referred to as the first inter-layer insulating film) 109 is formed on the element separation layer 104, semiconductor layer 103, and gate electrode 108. A first conductor 110 is formed through the first inter-layer insulating film 109, element separation layer 104, and buried oxide film 102 so as to electrically connect to the supporting substrate 101. A high-concentration implantation region 118 is formed in the supporting substrate 101 beneath the first conductor 110. In this event, the concentration of impurities implanted into the supporting substrate 101 is, for example, approximately $1 \times 10^{20\text{-}21}$ ions/cm$^3$.

A second conductor 111 is formed through the first inter-layer insulating film 109 to electrically connect to the gate electrode 108, and a third conductor 112 is formed through the first inter-layer insulating film 109 to electrically connect to the diffusion region 106 of the semiconductor layer 103. A first wiring layer 113 is formed on the first inter-layer insulating film 109. The first wiring layer 113 connects the desired second conductor 111 with the third conductor 112 to form a desired circuit. A fourth insulating layer (hereinafter referred to as the second inter-layer insulating film) 114 is formed on the first wiring layer 113 and first inter-layer insulating film 109. A fourth conductor 141 is formed through the second inter-layer insulating film 114 to electrically connect to the first conductor 110. Also, a fifth conductor 142 is formed through the second insulating film 114 to electrically connect to the second conductor 111 or third conductor 112.

A third inter-layer insulating film 116 is formed on the second inter-layer insulating film 114, fourth conductor 141, and fifth conductor 142. A sixth conductor 262 is formed through the third inter-layer insulating film 116 to electrically connect to the fifth conductor 142. A seventh conductor 261 is formed through the third inter-layer insulating film 116 to electrically connect to the fourth conductor 141. A first external terminal 217, which is a first electrode pad, is formed on the sixth conductor 262. A second external terminal 227, which is a second electrode pad, is formed on the seventh conductor 261. The structure up to the third inter-layer insulating film 116 is collectively referred to as a semiconductor chip 810.

A protection film 824 is formed on the third inter-layer insulating film 116 to expose the top surfaces of the first external terminal 217 and second external terminal 227. A first top layer wire 815 and a second top layer wire 825 are formed on the protection film 824. The first top layer wire 815 is electrically connected to the first external terminal 217. The second top layer wire 825 is electrically connected to the second external terminal 227. A sealing resin 826 is formed on the first top layer wire 815, second top layer wire 825 and protection film 824. An eighth conductor 881 is formed through the sealing resin 826 to electrically connect to the first top layer wire 815. An external terminal (hereinafter referred to as the bump) 817 is formed on the eighth conductor 881. Further, a conductive layer 828 is formed on the back surface (hereinafter referred to as the second surface) of the semiconductor chip 810. The conductive layer 828 may be formed of, for example, a deposited metal film, metal plating, a conductive paste, a conductive sheet or the like.

Next, as shown in FIGS. 6 and 7, on the semiconductor chip 810, there is a first region along the periphery of the first surface of the semiconductor chip 810, and a second region surrounded by the first region. The first external terminal 217, which is the first electrode pad, is formed in the first region, while the second external terminal 227, which is the second electrode pad, is formed in the second region. The first external terminal 217 is connected to an internal circuit, while the second external terminal 227 is electrically connected to the supporting substrate 101 of the semiconductor chip 810.

The bump 817 formed on the semiconductor chip 810 is connected to the first external terminal 217 through the first top layer wire 815 formed on the semiconductor chip 810. Further, the second top layer wire 825 is formed between the periphery of the first surface of the semiconductor chip 810 and the first external terminal 217, and the second top layer wire 825 surrounds the first external terminal 217. Further, the second top layer wire 825 is electrically connected to the second external terminal 227. When there is a plurality of second external terminals 227, all the second external terminals 227 are electrically connected through the second top layer wire 825 and fixed to the same potential. In the semiconductor device 800 used in this embodiment, the second top layer wire 825 is fixed to the GND potential. Therefore, among the whole first external terminals 217, some of the first external terminals 217 connected to the GND potential are electrically connected to the second external terminal 227 through the second top layer wire 825.

According to the structure of this embodiment, the first external terminal 217 is electrically connected to the second external terminal 227 through the top layer wire 825 in a similar manner to the second embodiment. Accordingly, an electrical charge generated on the supporting substrate 101 until the step of electrically connecting the first external terminal 217 to the second external terminal 227 is prevented from reaching the SOI transistor. It is therefore possible to prevent the gate insulating film of the SOI transistor from breakage and deterioration.

Further, by providing the second top layer wire 825 between the periphery of the first surface of the semiconductor chip 810 and the first external terminal 217, wires at the same potential can be routed all over the chip without the need for an additional space for wiring.

By providing the conductive layer 828 on the second surface of the semiconductor chip 810, the potential can be made uniform on the supporting substrate. Stated another way, it is possible to reduce variations in potential due to the distance from a connecting point of the supporting substrate 101 with the first conductor 110. It is therefore possible to reduce variations in characteristics of the SOI transistor.

Figure 9:
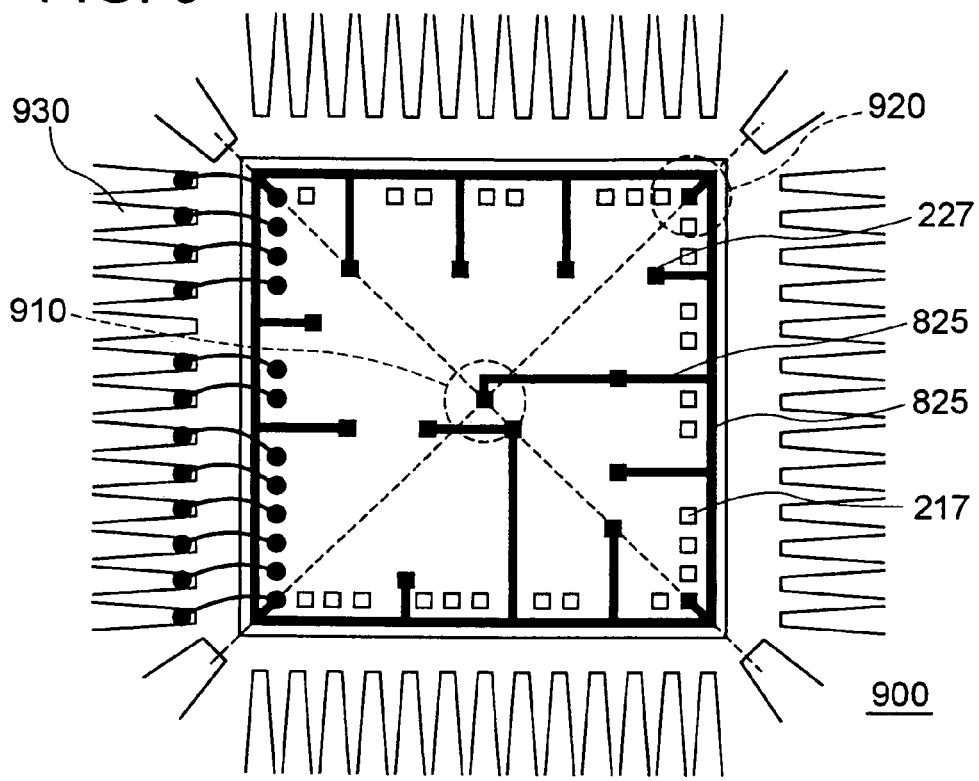
FIG. 9 is a top view showing a modification of the semiconductor device in the fourth embodiment of the present invention.

FIG. 9 is a top view showing a modification of the semiconductor device in the fourth embodiment of the present invention. With regard to the semiconductor chip 810 described above, the structure is similar. Describing the aforementioned contents in greater detail, the second terminal 227 is formed at a point 910 at which the diagonals of the semiconductor chip 810 intersect. Also, the second external terminals 227 are formed at corners 920 of the semiconductor chip 810.

A semiconductor device 900 has a lead frame 930. The first external terminal 217 is wire bonded to the lead frame 930. The second external terminals 227 formed at the corners 920 are also wire bonded to the lead frame 930.

According to the structure of this modification, if the second external terminal 227 is formed at least at the point 910 at which the diagonals of the semiconductor device 900 intersect, distribution of the fixed potential of the supporting substrate 101 of the semiconductor chip 810 is uniform in accordance with the distance from the point 910 at which the diagonals intersect. Further, by forming the second terminals 227 at the corners of the semiconductor chip 810, the features of the fourth embodiment can be obtained without providing a special space. By providing the second external terminals 227 at all the corners 920 of the semiconductor chip 810, the potential can be made uniform in accordance with the distance from the point 910 at which the diagonals intersect. Further, by providing the second external terminals 227 at the four corners 920 and at the point 910 at which the diagonals intersect in the semiconductor chip 810, the potential can be much more uniformly fixed.

Since the semiconductor device 900 of the modification has the first external terminal 217 and second external terminal 227 connected to the lead frame 930 through the wire bonding, it is possible to minimize variations in the characteristics of the SOI transistor in the wire bonding step. It is also possible to prevent the SOI transistor from breakage.

Fifth Embodiment

Figure 10:
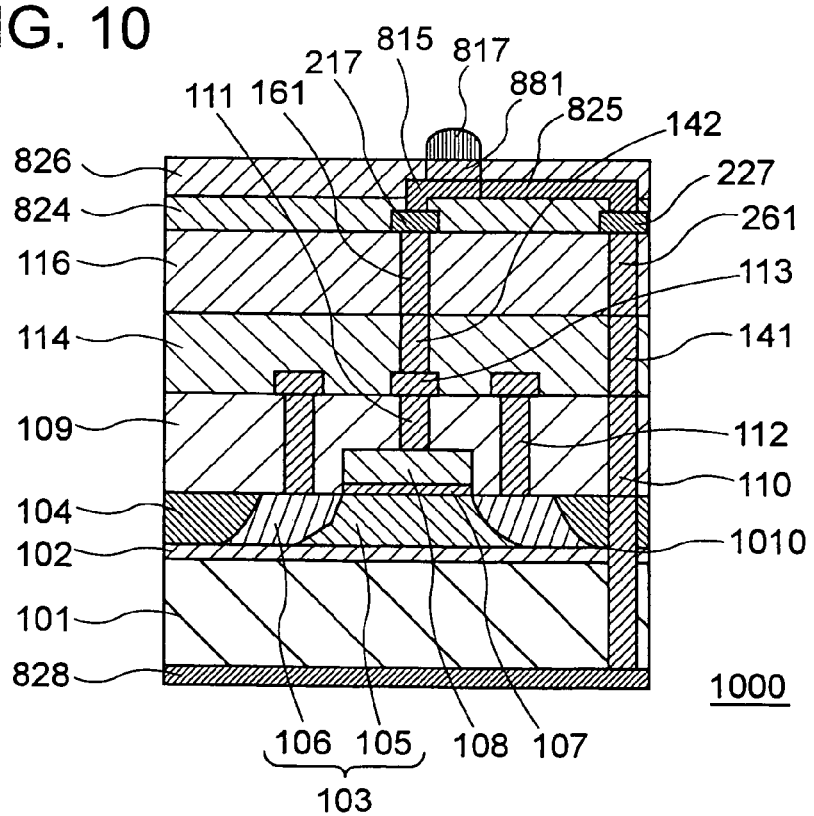
FIG. 10 is a cross-sectional view showing a semiconductor device in a fifth embodiment of the present invention.

FIG. 10 is a cross-sectional view of a semiconductor device in a fifth embodiment of the present invention. The same reference numerals are assigned for components identical to those in the fourth embodiment, and a description thereof is omitted.

In the fourth embodiment, the electrical connection between the second external terminal 227 and the supporting substrate 101 is made through the first conductor 110 penetrating the first inter-layer insulating film 109 and element separation layer 104, the fourth conductor 141 penetrating the second inter-layer insulating film 114, and the seventh conductor 261 penetrating the third inter-layer insulating layer.

In this embodiment, a through electrode 1010 is formed through the supporting substrate 101, buried oxide film 102, and element separation layer 104. The second external terminal 227 is electrically connected to the supporting substrate 101 through the first conductor 110, fourth conductor 141, and sixth conductor 261 which are electrically connected to the through electrode 1010. Also, a conductive layer 828 formed on the second surface of the semiconductor chip 810 serves to connect to the second external terminal 227.

Figure 11A:
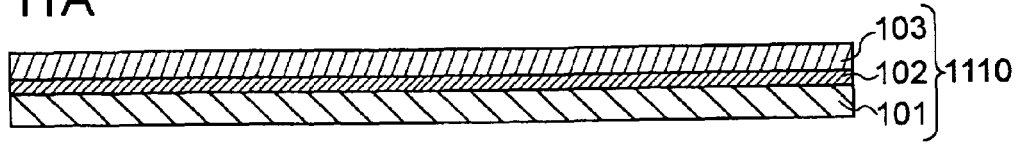
FIGS. 11A to 11F are process diagrams showing a method of manufacturing the semiconductor device in the fifth embodiment.

A manufacturing method of the semiconductor device of this embodiment will be described with reference to FIGS. 11A to 11F. As shown in FIG. 11A, the buried oxide film 102 is first formed on the supporting substrate 101, and the semiconductor layer 103 is formed on the buried oxide film 102 to provide a SOI wafer 1110.

Figure 11B:
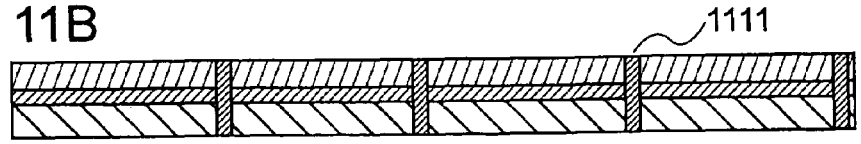

As shown in FIG. 11B, a throughhole is formed through the SOI wafer 1110 using sputtering or the like. A through electrode 1111 made of a copper or a tin alloy or the like is formed in the throughhole by a plating method, burying a conductive paste, a method of burying a molten metal, or the like.

Figure 11C:
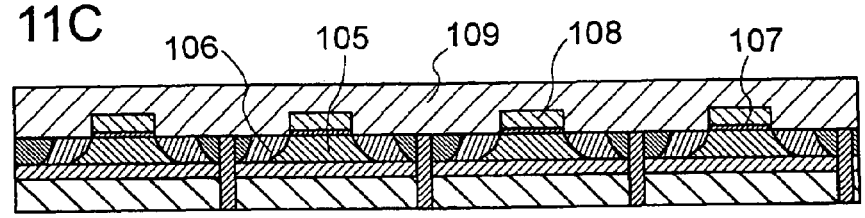

Next, as shown in FIG. 11C, a SOI transistor is formed to have the gate insulating film 107, gate electrode 108, channel region 105, and diffusion region 106 by using known technologies. Subsequently, the first inter-layer insulating film 109 is formed on the SOI transistor.

Figure 11D:
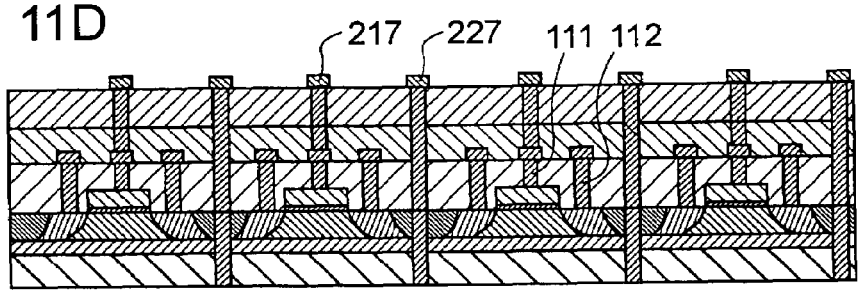

As shown in FIG. 11D, the second conductor 111 and third conductor 112 are formed to electrically connect to the SOI transistor, and the first conductor 110 and the like are formed to electrically connect to the through electrode. Subsequently, the first external terminal 217 electrically connected to the second conductor 111 and the second external terminal 227 electrically connected to the first conductor 110 are formed through a plurality of wiring layers and inter-layer insulating layers.

Figure 11E:
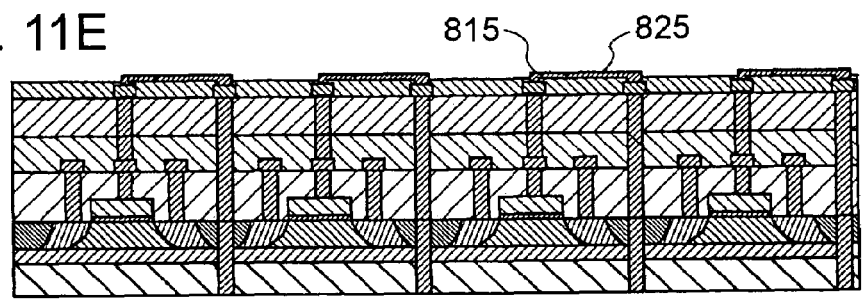

Subsequently, as shown in FIG. 11E, the first external terminal 217 and second external terminal 227 at predetermined locations are connected by forming the second top layer wire 825. When there is a plurality of second external terminals 227, all the terminals are connected through the second top layer wire 825. Simultaneously, the first top layer wire 815 is formed to electrically connect to the first external terminal 217 as required. However, as has been described in connection with the modification of the fourth embodiment, when a lead frame type semiconductor device is manufactured, the first external terminal 217 and second external terminal 227 are wire bonded to the lead frame 930 to build the semiconductor device, though not shown. Therefore, the step of FIG. 11E is followed by a conventional mold resin step.

Figure 11F:
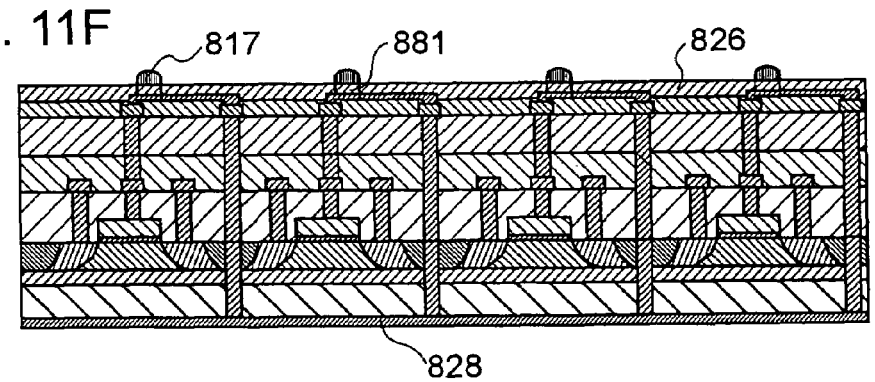

As shown in FIG. 11F, after a protective layer or the like, not shown, is formed on the first top layer wire 815, the eighth conductor 881 is formed. The sealing resin 826 is formed to fully cover the first top layer wire 815, second top layer wire 825, and eighth conductor 881 on the SOI wafer 1110. By polishing the surface of the sealing resin 826 to expose the eighth conductor 881, the bump 817 is formed on the eighth conductor 881. Also, the conductive layer 828 is formed on the supporting substrate 101 which is the back surface of the SOI wafer 1110. The conductive layer 828 may be made of, for example, a deposited metal film, metal plating, a conductive paste, a conductive sheet, or the like. Subsequently, though not shown, semiconductor chips are separated from the SOI wafer by dicing or the like to complete the semiconductor devices.

According to the structure of this embodiment, the SOI transistor is connected to the supporting substrate 101 exclusively through the first top layer wire 815 and second top layer wire 825, similar to the fourth embodiment, so that no electrical charge will be applied to the SOI transistor in steps before the formation of the first top layer wire 815 and second top layer wire 825. It is therefore possible to prevent the gate insulating film from breakage and deterioration.

Further, by providing the second top layer wire 825 between the periphery of the first surface of the semiconductor chip 810 and the first external terminal 217, wires at the same potential can be routed all over the chip without the need for an additional space for wiring.

Further, the conductive layer 828 is fixed to the same potential as the second external terminal 227 through the through electrode 910. In this embodiment, since the potentials of the second external terminal 227 and conductive layer 828 are fixed to GND, the entire second surface of the semiconductor chip 810 is fixed to the GND potential. Consequently, the supporting substrate 101 can be fixed to the GND potential without variations, thus making it possible to reduce variations in the characteristics of the SOI transistor.

According to the manufacturing method of this embodiment, the first external terminal 217 electrically connected to the SOI transistor is not electrically connected to the second external terminal 227 electrically connected to the supporting substrate 101 in a WP step which uses plasma CVD or the like. Also, even if the first external terminal 217 is electrically connected to the second external terminal 227 in an AP step, the SOI transistor can be realized without using a step which causes variations in the characteristics of the SOI transistor.

Also, by forming the through electrode 1111 through the SOI wafer 1110 in the step of FIG. 11B and forming the conductive layer 828 in the step of FIG. 11F, the potential of supporting substrate 101 can be fixed with less variations.

This application is based on a Japanese patent application No. 2005-141577 which is herein incorporated by reference.

What is claimed is:

1. A semiconductor device including a semiconductor layer having a channel region and a diffusion region sandwiching said channel region, and an element separation layer formed on a supporting substrate through a first insulating layer, said semiconductor device comprising:
    a gate electrode formed on said channel region of said semiconductor layer through a second insulating layer;
    a third insulating layer formed on said element separation layer, said semiconductor layer, and said gate electrode;
    a first wiring layer formed on said third insulating layer;
    a first conductor penetrating said third insulating layer, said element separation layer, and said first insulating layer so as to electrically connect to said supporting substrate;
    a second conductor penetrating said third insulating layer so as to electrically connect to said gate electrode;
    a third conductor penetrating said third insulating layer so as to electrically connect to said diffusion region of said semiconductor layer;
    a top layer wire formed on said first wiring layer through a fourth insulating layer so as to provide electrical connection between said first conductor and said second conductor or said third conductor; and
    an electrode pad formed on said top layer wire to provide electrical connection to said top layer wire.

2. A semiconductor device according to claim 1, wherein the electrical connection between said first conductor and said second conductor or said third conductor is made through the top layer wire which is beneath said electrode pad.

3. A semiconductor device including a semiconductor layer having a channel region and a diffusion region sandwiching said channel region, and an element separation layer formed on a supporting substrate through a first insulating layer, said semiconductor device comprising:
    a gate electrode formed on said channel region of said semiconductor layer through a second insulating layer;
    a third insulating layer formed on said element separation layer, said semiconductor layer, and said gate electrode;
    a first conductor penetrating said third insulating layer, said element separation layer, and said first insulating layer so as to electrically connect to said supporting substrate;
    a second conductor penetrating said third insulating layer so as to electrically connect to said gate electrode;
    a third conductor penetrating said third insulating layer so as to electrically connect to said diffusion region of said semiconductor layer;
    a first electrode pad formed on said first conductor through a plurality of wiring layers and a plurality of insulating layers to electrically connect to said first conductor; and
    a second electrode pad formed on said second conductor or said third conductor through the plurality of wiring layers and the plurality of insulating layers to electrically connect to one or both of said second conductor and said third conductor,
    wherein said first and second electrode pads are electrically connected to each other.

4. A semiconductor device according to claim 3, wherein said first electrode pad is electrically connected to said second electrode pad by wire bonding.

5. A semiconductor device including a semiconductor layer having a channel region and a diffusion region sandwiching said channel region, and an element separation layer formed on a supporting substrate through a first insulating layer, said semiconductor device comprising:
    a gate electrode formed on said channel region of said semiconductor layer through a second insulating layer;
    a third insulating layer formed on said element separation layer, said semiconductor layer, and said gate electrode;
    a first conductor penetrating said third insulating layer, said element separation layer, and said first insulating layer so as to electrically connect to said supporting substrate;
    a second conductor penetrating said third insulating layer so as to electrically connect to said gate electrode;
    a third conductor penetrating said third insulating layer so as to electrically connect to said diffusion region of said semiconductor layer;
    a first electrode pad formed on said first conductor through a plurality of wiring layers and a plurality of insulating layers to electrically connect to said first conductor; and
    a second electrode pad formed on said second conductor or said third conductor through the plurality of wiring layers and the plurality of insulating layers to electrically connect to one or both of said second conductor and said third conductor,
    wherein said first electrode pad and said second electrode pad are integrated with each other to provide electrical connection therebetween.

* * * * *